(12) United States Patent
Clevenger et al.

(10) Patent No.: US 8,183,694 B2
(45) Date of Patent: May 22, 2012

(54) REVERSING TONE OF PATTERNS ON INTEGRATED CIRCUIT AND NANOSCALE FABRICATION

(75) Inventors: Lawrence A. Clevenger, Hopewell Junction, NY (US); Maxime Darnon, Grenoble (FR); Anthony D. Lisi, Hopewell Junction, NY (US); Satya V. Nitta, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/021,774

(22) Filed: Feb. 6, 2011

(65) Prior Publication Data

US 2011/0121457 A1    May 26, 2011

Related U.S. Application Data

(62) Division of application No. 12/616,259, filed on Nov. 11, 2009, now Pat. No. 7,939,446.

(51) Int. Cl.
*H01L 29/40* (2006.01)

(52) U.S. Cl. .................................. 257/762; 257/774

(58) Field of Classification Search .......... 438/619–626; 257/762, 774
See application file for complete search history.

(56) References Cited

U.S. PATENT DOCUMENTS

| | | | |
|---|---|---|---|
| 7,282,311 B2 | 10/2007 | Little et al. | 430/22 |
| 7,384,852 B2 | 6/2008 | Yang et al. | 438/299 |
| 7,405,147 B2 | 7/2008 | Edelstein et al. | 438/618 |
| 7,435,671 B2 | 10/2008 | Fuller et al. | 438/591 |
| 7,939,446 B1 * | 5/2011 | Clevenger et al. | 438/619 |
| 2005/0167838 A1 | 8/2005 | Eddlestein et al. | 257/758 |
| 2008/0122106 A1 | 5/2008 | Nitta et al. | 257/773 |
| 2008/0224255 A1 | 9/2008 | Kim et al. | 257/506 |
| 2008/0254630 A1 | 10/2008 | Edlestein et al. | 438/694 |

OTHER PUBLICATIONS

Kogge, Peter, et al. "ExaScale Computing Study . . . ," Sep. 28, 2008 p. 161 *Information Processing Techniques Office, Air Force Research Laboratories*.

* cited by examiner

*Primary Examiner* — Richard A. Booth
(74) *Attorney, Agent, or Firm* — Robert J. Eichelburg; The Law Offices of Robert J. Eichelburg

(57) ABSTRACT

A process to produce an airgap on a substrate having a dielectric layer comprises defining lines by lithography where airgaps are required. The lines' dimensions are shrunk by a trimming process (isotropic etching). The tone of the patterns is reversed by applying a planarizing layer which is etched down to the top of the patterns. The photoresist is removed, leading to sub-lithographic trenches which are transferred into a cap layer and eventually into the dielectric between two metal lines. The exposed dielectric is eventually damaged, and is etched out, leading to airgaps between metal lines. The gap is sealed by the pinch-off occurring during the deposition of the subsequent dielectric.

42 Claims, 6 Drawing Sheets

REVERSING TONE OF PATTERNS ON INTEGRATED CIRCUIT AND NANOSCALE FABRICATION

Applicant claims the benefits of and files this application pursuant to 35 U.S.C. §120 as a divisional application of U.S. patent application Ser. No. 12/616,259 filed Nov. 11, 2009, the contents of which are incorporated herein in their entirety, application Ser. No. 12/616,259 now U.S. Pat. No. 7,939,446.

DESCRIPTION OF THE INVENTION

1. Field of the Invention

The field of the invention comprises a process of producing an airgap-containing metal-insulator interconnect structures for Very Large Scale Integrated ("VLSI") and Ultra-Large Scale Integrated ("ULSI") devices.

2. Background of the Invention and Related Art

There are many known techniques for lowering the effective dielectric constant for the dielectrics used in semiconductor devices. However, most of these methods suffer from several drawbacks including most importantly, poor mechanical strength. This poor mechanical strength results in reliability issues in the final device.

For example, Edelstein et al., US20050167838A1 discloses one methodology for creating insulator voids (gaps, airgaps, etc.) in dielectric materials embedded in multilevel integrated interconnect structures to lower the effective dielectric constant which includes the combination of supra-plus sub-lithographic masking to create selectively blocked-out nanocolumns or airgaps in an already-built wiring level. The process includes at least one layer of a block out mask and a layer of diblock copolymer which forms self assembled holes (200 Å) in a polymeric matrix which are then transferred into the underlying dielectric to create a nanocolumnar structure. Edelstein et al. further describe ways to isotropically increase column or gap size underneath a perforated mask, such that larger gaps could be made without impacting rapid pinch-off. Problems, however, exist with this process. For example, it is not readily practicable for larger dimension copper wiring levels. When supra-lithographic block out shapes are combined with a self assembled layer to create a sublithographic nanocolumnar structure, significant areas of the copper interconnect surfaces are exposed to etch, strip, and wet clean processes through the nano-sized perforated holes in the cap. Although these holes may be plugged by the subsequent pinch-off deposition of an additional cap dielectric material, there may be excessive copper sputtered through the holes, and possibly integration defects associated with these copper and copper/cap interface exposures. Another potential problem is scaling to very large dimension wiring levels due to increased aspect ratios for nanocolumn etching, assuming the sublithographic mask holes could not be scaled accordingly. Finally, such process requires two cycles of mask apply, develop, and reactive ion etching for the diblock and blockout pattern transfer.

A different process for forming an airgap is possible using electron-beam and UV radiation to selectively damage the SiCOH interlayer dielectric. A blockout mask limits exposure to the electron-beam or UV such that only the areas not covered by the blockout mask get exposed to the radiation with the result that the exposed regions of the dielectric are demethylated and are thus rendered etchable. However, the depth and extent to which the UV or the e-beam demethylates, and thus damages the SiCOH dielectric has limits and data have to be provided to determine whether the damaged dielectric extends all the way to the depth of the trench. Furthermore, the use of electron-beam significantly increases the time of processing and the cost of ownership.

An etchback process is disclosed in Integration of a 3 Level Cu—$SiO_2$ Airgap Interconnect for Sub 0.1 micron CMOS Technologies (Arnal et al., 2001 Proc. IEEE International Interconnect Technology Conference, pp. 298-300), wherein a full trench is etched through a lithographic mask into the underlying dielectric. A pinch-off airgap is then formed during the deposition of the next level of dielectric. This process has several drawbacks including problems of excess topography in the next level after dielectric deposition which requires added chemically-mechanically polished touchup or changes to the interlayer dielectric process as well as excess redeposition in airgaps, and in the extreme, pinch-off points which are so high that they can interfere with trenches on the subsequent wiring level. Additionally, in this process, there will be situations where there are several levels of dielectric and pinch-off airgap that can be stacked on top of each other without any intervening compressive film to break up the buildup of tensile stress with the result that this structure is mechanically unstable. Finally, this process does not scale well with shrinking dimensions and airgaps at the thin wire level using aggressive shrink factors cannot easily be fabricated using it due to the fact that there will be exposed copper along the entire length of an interconnect during the etchback resulting in electromigration failures during reliability stressing. Another drawback is the use of a specific mask for gap definition which increases the cost.

Thus there exists a need for an airgap process which eliminates exposed copper during etching. A further need exists for an airgap process where no additional high definition mask is required.

These needs and many others are met by a process for producing airgaps on a substrate using the inventive process which uses a reverse tone and trimming process to define sub ground-rule lithographic trenches. Other advantages of the present invention will become apparent from the following description and appended claims.

SUMMARY OF THE INVENTION

Accordingly, the present invention provides structures, articles of manufacture and process that address these needs to not only provide advantages over the related art, but also to substantially obviate one or more of the foregoing and other limitations and disadvantages of the related art such as providing a structural process for nanofabrication. Not only do the written description, claims, abstract of the disclosure, and the drawings that follow set forth various features, objectives, and advantages of the invention and how they may be realized and obtained, but these features, objectives, and advantages will also become apparent by practicing the invention.

To achieve these and other advantages, and in accordance with the purpose of the invention as embodied and broadly described herein, the invention comprises a process to produce an airgap on a substrate comprising a dielectric layer on the substrate, and a pattern transferred onto a dielectric layer using a sub-ground rule mask. Sub-ground rule lithography is achieved by trimming and reversing the tone of a mask. Kim et al., U.S. Pat. No. 7,393,738 and Fuller et al. U.S. Pat. No. 7,435,671. Fuller et al. describe sub-ground rule dimensions in photolithography as those less than about 40 nanometers. Chung et al. *Deep-Submicrometer MOS Device Fabrication Using a Photoresist Ashing Technique*, IEEE Electron Device Letters, Vol. 9, no. 4, April 1988, describes a relevant prior art process for effecting the trimming, whereas for 11 nm features after trimming, which is a part of the invention, e.g., by HF dip, can be effected by a process described by Pargon, et al., *Towards a Controlled Patterning of 10 nm Silicon Gates in High Density Plasmas*, J. Vac. Sci. Technol. B 23, 5, September/October 2005.

BRIEF DESCRIPTION OF THE DRAWINGS

FIG. 1 comprising FIGS. 1*a*, 1*b*, 1*c*, 1*d*, 1*e*, 1*f*, 1*g*, 1*h*, and 1*i*, is a process flow of the present invention for generating airgaps.

FIG. 2, comprising FIGS. 2*a*, 2*b*, 2*c*, 2*d*, 2*e*, 2*f*, 2*g*, and 2*h* illustrates an alternate process flow of the present invention for generating airgaps.

DETAILED DESCRIPTION

The invention comprises a process to produce airgap-containing metal-insulator interconnects structure for VLSI and ULSI devices. A conventional lithographic mask is used which has specific and carefully defined line patterns to cover areas where gaps are desired. In another embodiment employing projection lithography, we use a reticule that is the same as the one used to define the metal lines underneath. In this case, a lower resolution lithographic mask defines blockout shapes to cover areas where gaps are not desired. In both cases, the size of the patterns in the mask is shrunk, and the tone of the patterns is reversed.

Little et al. U.S. Pat. No. 7,282,311 describe lithographic methods for exposing mask images onto a photoresist covered substrate, identifying the three major types of photolithography as contact printing, proximity printing, and projection printing or projection lithography. The mask used in projection lithography is commonly called a reticule. We describe the present invention in terms of methods comprising projection lithography although the invention also applies to contact printing and proximity printing.

More specifically, the present invention comprises a process to fabricate an effective very low dielectric constant structure comprising depositing on a substrate layer at least one dielectric layer lying between interconnects, and then depositing on the at least one dielectric layer at least one layer comprising a cap layer followed by depositing layers comprising a sacrificial organic layer, low temperature oxide layer, ARC layer and a sacrificial first lithographic resist layer in that order on the cap layer.

We follow this by applying on the sacrificial first lithographic resist layer a mask comprising a blockout mask with lines that project into an area between and that do not overlie the interconnects, and lithographically developing the sacrificial first lithographic resist layer through the blockout mask to form a pattern of the lines in the sacrificial first lithographic resist layer.

This is followed by shrinking the dimension of the pattern of lines by etching wherein the etching comprises isotropic etching, applying a planarizing layer that extends between and above the pattern of lines to obtain a planarizing layer with the pattern of lines, and reducing the thickness of the planarizing layer with the pattern of lines to expose the pattern of lines as a reversed tone pattern of lines in the planarizing layer which also comprises a trench pattern in the planarizing layer.

We then selectively etch the photoresist through the trench pattern in the planarizing layer as a mask, transfer the trench pattern through the ARC layer, low temperature oxide layer, sacrificial organic layer, and the cap layer, and onto the at least one dielectric layer to form a trench corresponding to the trench pattern and to form a cap layer having perforations. We then form an airgap comprising extracting the one dielectric layer between the interconnects, the extracting being conducted through the cap layer having perforations, and through the trench, with the airgap extending from a point in the trench in the region of the cap layer having perforations to a region between the interconnects.

In one embodiment of the invention, we deposit a layer comprising at least a second dielectric layer on the cap layer having perforations that extend into and coats the surface of the airgap and then pinch-off the cap layer having perforations with the second dielectric layer to provide a pinched-off airgap.

In another embodiment, we provide a process to fabricate an effective very low dielectric constant interconnect structure comprising depositing on a substrate layer at least one dielectric layer lying between interconnects, and then depositing on the at least one dielectric layer at least one layer comprising a cap layer followed by depositing layers comprising a sacrificial organic layer, low temperature oxide layer, ARC layer and a sacrificial first lithographic resist layer in that order on the cap layer. We follow this by applying on the sacrificial first lithographic resist layer a mask comprising a blockout mask with lines that project into an area between and that do not overlie the interconnects, and lithographically developing the sacrificial first lithographic resist layer through the blockout mask to form a pattern of the lines in the sacrificial first lithographic resist layer. In an aspect of this embodiment, the first lithographic step comprises projection lithography and employs a reticle corresponding to the interconnects.

This is followed by shrinking the dimension of the pattern of lines by etching wherein the etching comprises isotropic etching, partially transferring the pattern of lines into the low temperature oxide layer, applying a planarizing layer that extends between and above the pattern of lines to obtain a planarizing layer with the pattern of lines, and applying to the planarizing layer with the pattern of lines, a second lithographic blockout mask with patterns where no gaps are desired in the region underlying the second lithographic block out mask.

We then reduce the thickness of the planarizing layer with the pattern of lines to expose the pattern of lines as a reversed tone pattern of lines in the planarizing layer which also comprises a trench pattern in the planarizing layer. This is followed by selectively etching the low temperature oxide through the trench pattern in the planarizing layer and the second lithographic block out, where the trench pattern in the planarizing layer and the second lithographic block out comprise masks for the selective etching.

The next step comprises transferring the trench pattern through the ARC layer, low temperature oxide layer, sacrificial organic layer, and the cap layer, and onto the at least one dielectric layer to form a trench corresponding to the trench pattern and to form a cap layer having perforations.

An airgap is then formed by extracting the at least one dielectric layer between the interconnects, the extracting being conducted through the cap layer having perforations and the trench, with the airgap extending from a point in the trench in the region of the cap layer having perforations to a region between the interconnects.

In one embodiment of the invention, we pinch-off the airgap by depositing a layer comprising at least a second dielectric layer on the cap layer having perforations that extend into and coats the surface of the airgap and then pinching-off the cap layer having perforations with the second dielectric layer to provide a pinched-off airgap.

We use various terms to describe the invention, which we define as follows:
- a substrate layer which comprises a silicon wafer, silicon wafer with interconnect levels, silicon wafer with devices, silicon wafer with devices and interconnect levels from about 100 microns to about 1 mm, or in one embodiment, about 800 microns;
- a first dielectric layer which comprises $SiO_2$, porous SiCOH, dense SiCOH, OMCTS™, Black Diamond™, Poly Oxy Carbo Silane, Methyl Silsesqioxane, any of which have a thickness of from about 50 nm to several microns, and which in one embodiment of the invention comprises about 2 to about 5 microns;
- at least a second dielectric layer which comprises $SiO_2$, porous SiCOH, dense SiCOH, OMCTS™, Black Diamond™, Poly Oxy Carbo Silane, Methyl Silsesqioxane, any of which have a thickness of from about 50 nm to several microns, and which in one embodiment of the invention comprises about 2 to about 5 microns;
- an interconnect material, comprising Cu, Au, Al and the like; Cu, Al, TiN, Ti, TaN, Ta, W and combinations of Cu, Al, TiN, Ti, TaN, Ta, W including mixtures and alloys thereof, any of which have a thickness of from about 25 nm to several microns;
- a cap layer comprising SiC, SiCN, NBlok™, Bolk™, any of which have a thickness of from about 2.5 nm to about 100 nm, and in one embodiment of the invention about 35 nm;
- a sacrificial organic layer comprises Near Frictionless Carbon (NFC™), HM8006™, HM8005™, SilK™, a photoresist, any of which have a thickness of from about 500 Å to about 8,000 Å, and in one embodiment, about 2,000 Å;
- a low temperature oxide layer comprising $SiO_2$, which has a thickness of from about 100 Å to about 10,000 Å, and in one embodiment, about 400 Å;
- a first lithographic resist layer which has a thickness of from about 1000 Å to about 8,000 Å, and in one embodiment, about 4,000 Å;
- a second lithographic resist layer which has a thickness of from about 1000 Å to about 8,000 Å, and in one embodiment, about 4,000 Å;
- a block out mask comprising a reticule;
- a planarizing layer comprising Near Frictionless Carbon (NFC™), HM8006™, HM8005™, SilK™, or a photoresist, any of which have a thickness of from about 500 Å to about 8,000 Å, and in one embodiment, about 2,000 Å;

The physical dimensions of the article of manufacture of the invention include:
- a range of depths and widths for the airgap/trench where the depth of airgap in one embodiment comprises a depth substantially equal to or up to about 50% greater than the width of the trench layer, and can range from about 50 nm to about 1,000 nm;
- a range of widths for the perforations comprises anywhere from about 20 nm to about 100 nm, and in one embodiment closer to about 20 nm;
- a range of distances between the interconnects from about 35 nm to about 1,000 nm; and
- a range of widths and heights of the interconnects where the interconnect widths vary from about 35 nm to several microns such as from about 2 microns to about 10 microns, and the height varies from about 50 nm to about 1,000 nm.

The invention includes other embodiments as well which include using interconnects comprising copper interconnects; reducing the planarizing layer with the pattern of lines by a process comprising etching or chemical mechanical polishing; employing patterns in the blockout masks that comprise sub-lithographic patterns or supra-lithographic patterns; optionally transferring the patterns in the dielectric layer using reactive ion etching; extending the interconnects to a level into the at least one dielectric layer and the trenches into the at least one dielectric layer to a level beyond the deepest level of the interconnects, e.g., extending the trench into the at least one dielectric layer to a level at least about 25% deeper than the deepest level of the interconnects.

Further aspects of the invention comprise embodiments wherein the width of the airgaps between the trenches comprises a width at least as small as the minimum distance between the interconnects; as well as a width smaller than the minimum distance between the interconnects.

Additionally, the process of the invention may comprise depositing a conformal layer on the cap layer; The conformal layer comprises a dielectric layer of either $SiO_2$, porous SiCOH, dense SiCOH, OMCTS™, Black Diamond™, Poly Oxy Carbo Silane, Methyl Silsesqioxane, or and combination these films and etching through the bottom of the conformal layer, where the thickness of the conformal layer may comprise a thickness from about 5 nm to about 25 nm, and may be deposited by a process comprising CVD, ALD, spin-on or combinations thereof, Other embodiments of the invention comprise depositing an imprintable mask layer on the low temperature oxide layer in place of the ARC and resist layers, and transferring the pattern into the underlying layers and optionally, the dielectric layer.

As noted before, we employ an extracting step which may comprise an etching step, such as etching with a vapor based etchant, wet etchant, $CO_2$ based etchant and combinations thereof. These etchants comprise an acidic etchant, e.g., a hydrofluoric based etchant, or a basic etchant, such as an ammonium hydroxide etchant. Examples of these comprise, but are not limited to dilute hydrofluoric acid (DHF) or other fluorine based etchants and the equivalents thereof, or ammonium hydroxide based etchants or other basic nitrogen compound etchants and the equivalents thereof. Other embodiments comprise depositing at least a second cap layer prior to the deposition of the second dielectric layer, and if employed, perforations pinched-off by the deposition of the second cap layer. The pinch off can occur during the cap layer deposition or the second dielectric layer deposition. In one embodiment it occurs during the second dielectric layer deposition. In any event, the pinch off occurs during the dielectric layer deposition. Stated otherwise, there can be two dielectric layers, (cap layer and dielectric layer), and pinch off would occur in one of them, where the cap layer would also comprise a dielectric layer.

A process flow for the process of the invention is shown in FIG. 1. The desired metal-insulator dual damascene interconnects level which needs to be gapped is built all the way up to the deposition of the dielectric cap using methods known in the art. Following this, an organic layer, a low temperature silicon oxide ("LTO"), an antireflective coating ("ARC") and a resist layer are deposited directly on the cap layer. Subsequently, a blockout mask is used to pattern the resist layer in that order. In the blockout mask, the patterns are in the shape of lines and are at locations where gaps are required.

After lithography, the size of the patterns is shrunk by an isotropic etching of the resist (trimming process) that is well known in the art. Then, the tone of the blockout mask pattern is reversed. For this, a planarizing layer is deposited on the patterns and etched back until the top of the initial patterns is exposed. The planarizing layer then plays the role of a mask to etch the initial resist and the underlying materials. Thus, trenches are transferred into the underlying cap material and all the way into the underlying dielectric as shown in FIG. 1.

Subsequently, an ash step is used to remove the organic material and also to optionally damage the dielectric on the sides of the transferred patterns. The modification of the dielectric material sidewalls to obtain a modified material is necessary if the underlying dielectric is an organosilicate material such as a dense or porous, spin-on or CVD, SiCOH based material. We use the process described in copending U.S. patent application Ser. No. 12/510,001, filed Jul. 27, 2009 to perform this modification, and the other modifications referred to in this specification to obtain the modified material. The next step involves the use of any wet etchant, such as but not limited to dilute hydrofluoric acid (DHF) or other fluorine based etchants and the equivalents thereof, or ammonium hydroxide based etchants or other basic nitrogen compound etchants and the equivalents thereof to remove the modified dielectric, and to leave behind a completely evacuated gap. The wet etchant can also be used to remove any residues at the surface of the wafer or substrate and any resputtered copper or other metal interconnect should the trench still accidentally intersect the copper or other metal interconnect.

Prior to the deposition of the next level dielectric, an optional flash deposition of the cap dielectric may be employed should there be any exposed copper during the etchback.

The gap is sealed to leave behind a full airgap in between the interconnect wires by the deposition of the subsequent level dielectric. We show the "subsequent level dielectric" as the top layer in FIG. 1*i*.

In order to ensure that there is absolutely no exposed copper during the etch and ash steps, sub-lithographic trenches must be employed as described below.

In one embodiment of the invention, the mask used for lithography is specifically designed to pattern lines where the gap is required. The sub-lithographic patterns are obtained by trimming the photoresist of lithographic patterns. Then, the lines are converted into trenches by using a planarizing layer and an etch back process.

Figure 1A:
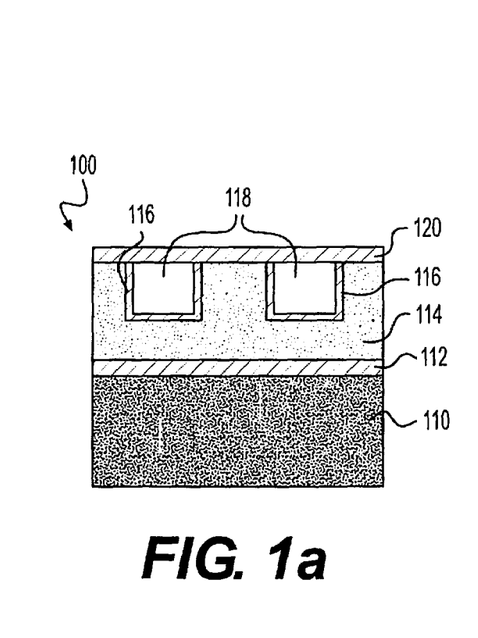
FIG. 1*a* comprises a side elevation in cross section of a semiconductor device illustrating a standard interconnect level.
Figure 1B:
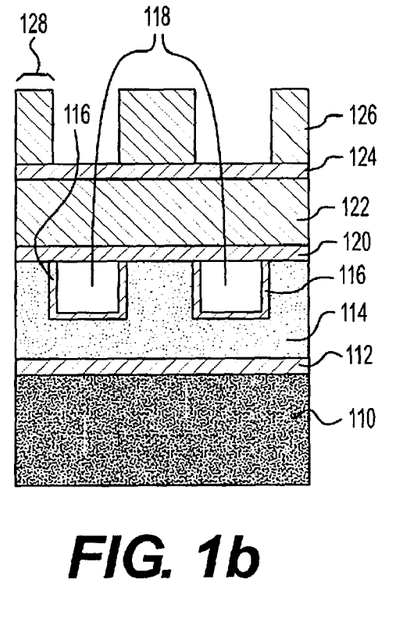
FIG. 1*b* comprises a side elevation in cross section of a semiconductor device illustrating deposition of the organic layer, low temperature oxide, and lithography of the invention.
Figure 1C:
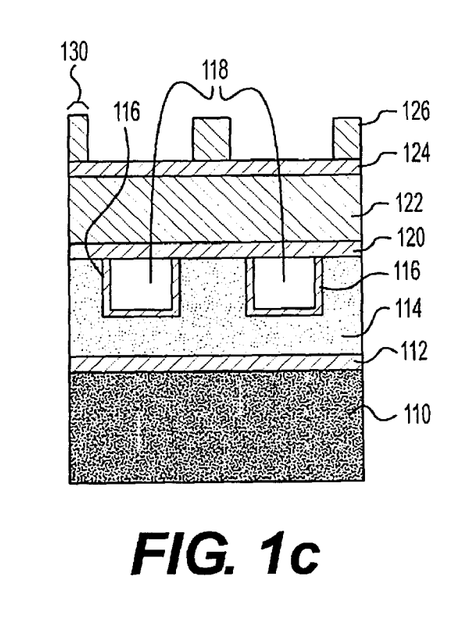
FIG. 1*c* comprises a side elevation in cross section of a semiconductor device illustrating pattern size shrink of the invention.
Figure 1D:
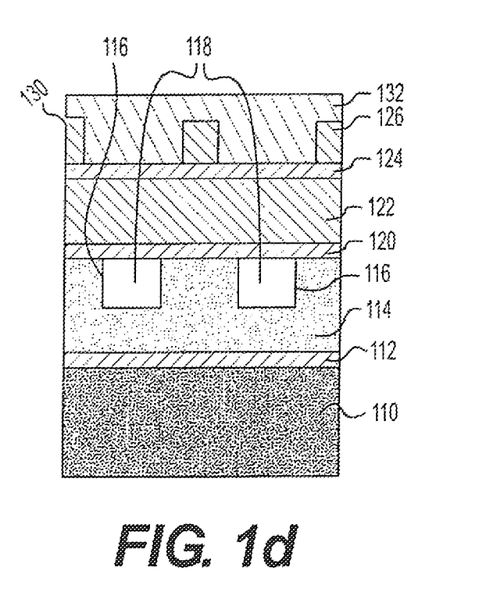
FIG. 1*d* comprises a side elevation in cross section of a semiconductor device illustrating planarizing layer deposition of the invention.
Figure 1E:
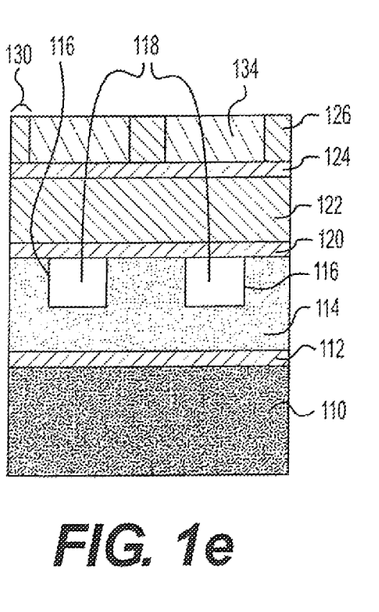
FIG. 1*e* comprises a side elevation in cross section of a semiconductor device illustrating etch back of the planarizing layer of the invention.
Figure 1F:
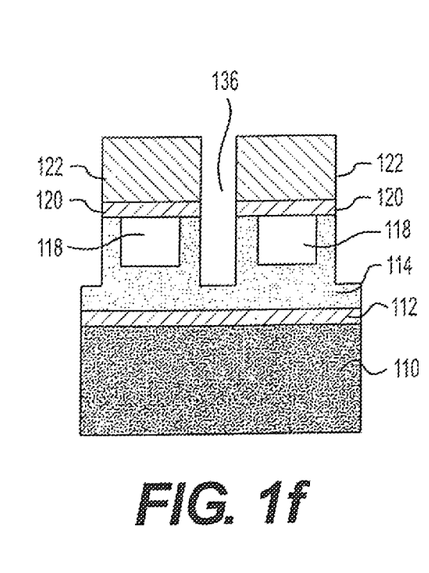
FIG. 1*f* comprises a side elevation in cross section of a semiconductor device illustrating pattern transfer of the invention.
Figure 1G:
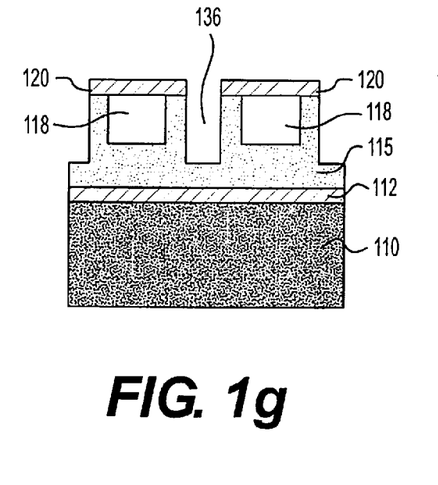
FIG. 1*g* comprises a side elevation in cross section of a semiconductor device illustrating photoresist removal and dielectric modification of the invention.
Figure 1H:
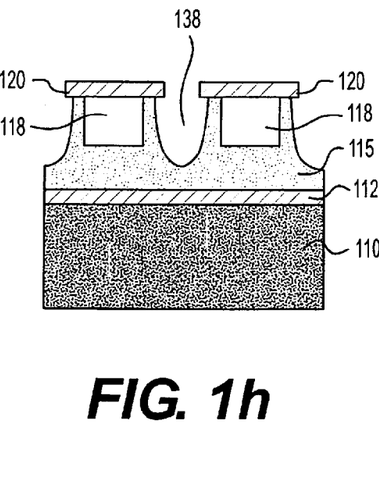
FIG. 1*h* comprises a side elevation in cross section of a semiconductor device illustrating modified dielectric removal of the invention.
Figure 1I:
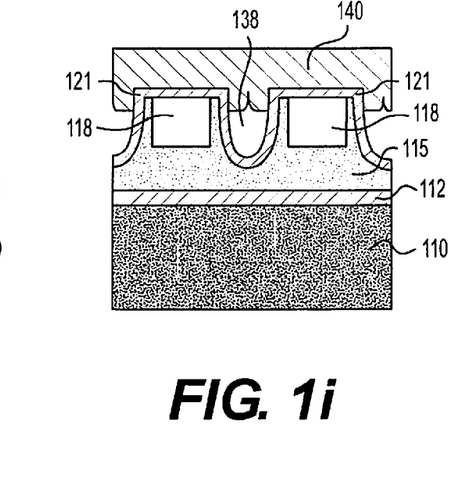
FIG. 1*i* comprises a side elevation in cross section of a semiconductor device illustrating dielectric deposition and pinch-off of this dielectric layer of the invention. The pinch-off occurs during the dielectric deposition. In one embodiment only one dielectric layer is deposited and pinched off; however, there can be two dielectric layers (cap layer and dielectric layer). Pinch-off would occur in one of them.
Figure 2A:
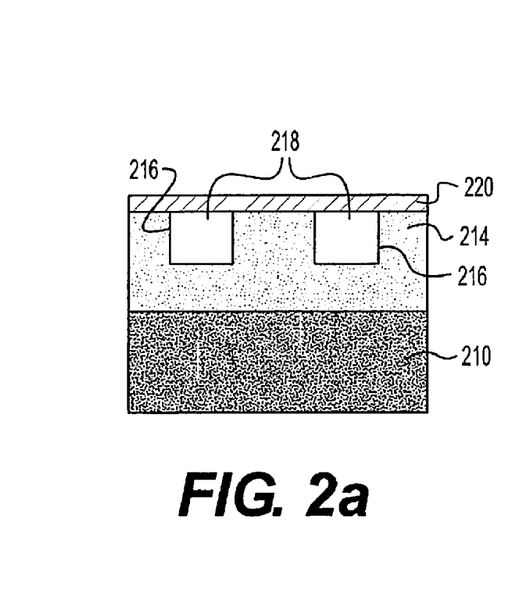
FIG. 2*a* comprises a side elevation in cross section of a semiconductor device showing a standard interconnect level used in the invention.
Figure 2B:
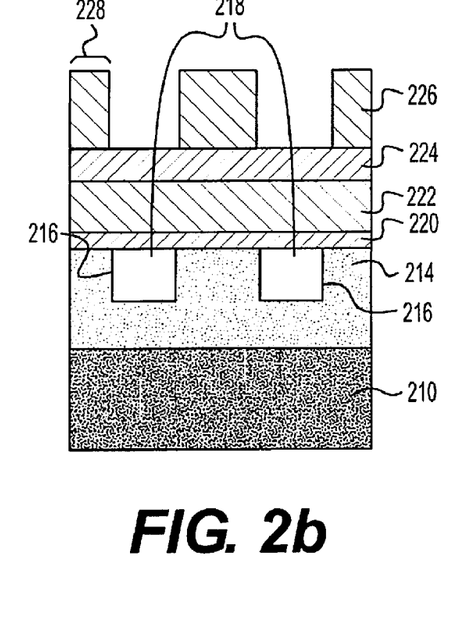
FIG. 2*b* comprises a side elevation in cross section of a semiconductor device showing deposition of an organic layer, low temperature oxide, and lithography with the same reticle as the underlying metal level of the invention.
Figure 2C:
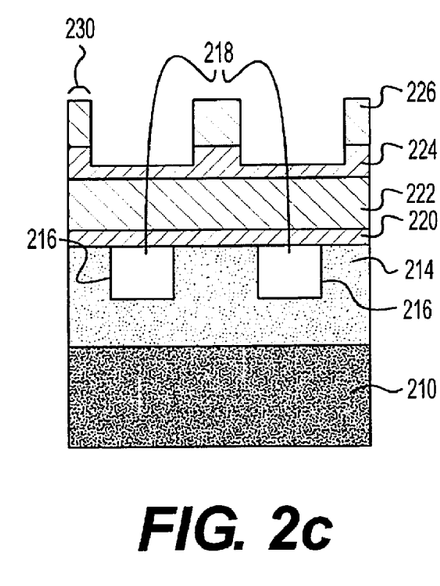
FIG. 2*c* comprises a side elevation in cross section of a semiconductor device showing a pattern size shrink of the invention.
Figure 2D:
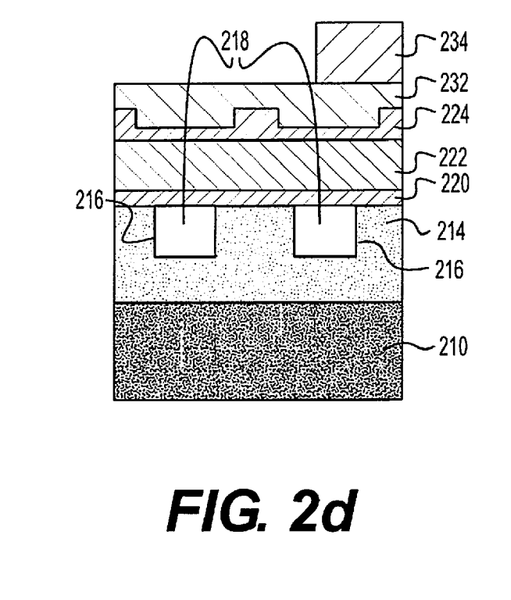
FIG. 2*d* comprises a side elevation in cross section of a semiconductor device showing a planarizing layer deposition and second lithography of the invention.

FIGS. 2*a* through 2*c* are substantially the same as FIGS. 1*a* through 1*c* with, e.g., one exception. The Low Temperature Oxide layer ("LTO" layer) in FIG. 2 is thicker than the LTO layer in FIG. 1. In FIG. 2*d* the LTO layer is partially etched. FIGS. 2*e* through 2*h* correspond to and are similar to FIGS. 1*e* through 1*i*, except that they illustrate different aspects of the invention.

In another embodiment of the invention, the mask used to define patterns is identical to the mask used to define the underlying metal level. The patterns size is shrunk by isotropic etching, and partially transferred into the low temperature oxide. The resist and the ARC are then removed and the planarizing layer is deposited on the wafer. A second lithography using a specific mask is then done. This second mask is specially designed to protect any surface on which no airgap is desired. The planarizing layer can be used as an anti reflective coating for this lithography, or a specific ARC can be added. The etch back of the planarizing layer is performed in open areas down to the top of the oxide patterns. The second lithography resist and the planarizing layer are then used as mask to remove the uncovered LTO layer and the underlying materials.

While not being bound by any theory, we believe the present invention's use of sub-spacing openings allows isotropic etch extraction of interlayer dielectric material to gap widths larger than the mask openings. This improves gap size versus pinch off size and allows for lower capacitances. Further, by appropriately choosing the interlayer dielectric and the etchant, and by employing interlayer dielectric modification ("damage") mechanisms, it is possible to transfer the trench pattern only partially or minimally through the cap, and then enlarge the trench in the interlayer dielectric underneath the cap by isotropic etching using a selective wet or SC $CO_2$ based etchant or vapor etchant.

The present invention leads to suitable combinations of wire-level scaling, image and overlay tolerances, mask resolution and airgap sizes. All of the copper shapes may be protected by block out shapes as only the spaces between the copper are exposed for the pattern transfer for worst-case tolerance deviations. Thanks to the pattern shrinking, additional tolerance is obtained with this scheme. Thus, the present invention prevents exposed copper during etching.

In order to facilitate easy pinch-off and minimize dielectric redeposition within the gaps, specific gap etch patterns are defined which have at least one dimension smaller than the interline spacing. The present invention further lifts limits on the maximum scale size for gaps below wiring trenches, where, for example, a diblock scheme with limited hole diameter might start to fail at the largest desired wiring level scales. In addition, the pinch-off heights of the present invention are limited such that the trench bottoms from the subsequent level do not intersect the pinch-off gaps.

The airgap structure of the present invention exhibits no build-up of topography after the subsequent level dielectric deposition.

The airgap structure of the present invention also includes a compressive film at every level to interrupt the build up of the gaps and tensile stress areas.

In addition, the present inventive process results in an airgap depth not limited by limitations of etch due to high aspect ratios. The inventive process does not limit the depth to which the dielectric can be modified and thus rendered etchable.

In the drawings, FIG. 1a illustrates a standard interconnect level for an electronic device 100 such as a semiconductor device, comprising a substrate such as a silicon wafer known in the art, with a dielectric layer(s) 112, a separate dielectric 114, trenches 116, having placed therein an electrical conductor 118 such as copper, and a cap 120 on top of the trenches and the conductor. FIG. 1b illustrates the deposition of an organic layer 122 on the device 100, according to one of the methods of the invention, along with a low temperature oxide 124 and a lithographic layer 126 which has been exposed and developed to produce a pattern 128. FIG. 1c illustrates pattern size shrink where the pattern 128 size is shrunk down to a pattern size 130. FIG. 1d illustrates a planarizing layer deposition of planarizing layer 132 whereas FIG. 1e illustrates the etch back of layer 132 to layer 134. FIG. 1f illustrates a pattern transfer with the removal of elements 124, 126, 130, and 134, that leaves a trench 136 in the device. FIG. 1g illustrates the device of the invention after removal of the photoresist 122 and modification of dielectric 114 to produce modified dielectric 115 according to the process of the invention. FIG. 1h illustrates a device with partial removal of dielectric 118 to form a modified trench 138 and a narrowing of the walls of modified dielectric 115 that extend around conductor 118. FIG. 1i illustrates a device with conductor 118 surrounded with a deposited dielectric 121 which is an extension of the dielectric 120 of FIG. 1h. This device includes a further dielectric 140 deposited on dielectric 121 to pinch off modified trench 138, thereby forming an airgap as described herein.

Figure 2E:
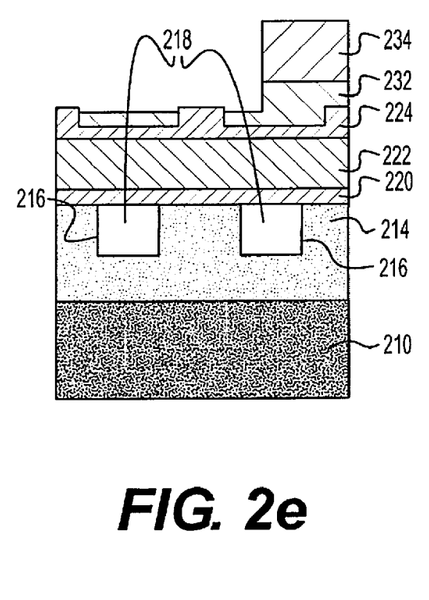
FIG. 2*e* comprises a side elevation in cross section of a semiconductor device showing an etchback of the planarizing layer of the invention.
Figure 2F:
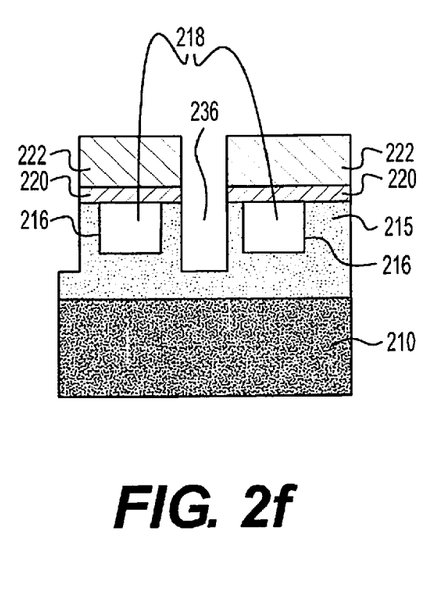
FIG. 2*f* comprises a side elevation in cross section of a semiconductor device showing a pattern transfer of the invention.
Figure 2G:
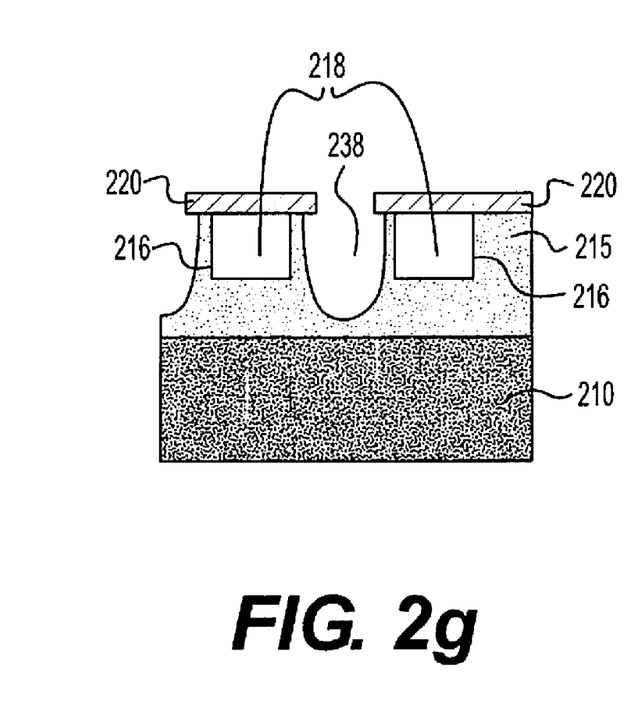
FIG. 2*g* comprises a side elevation in cross section of a semiconductor device showing photoresist removal, dielectric modification and modified dielectric removal of the invention.
Figure 2H:
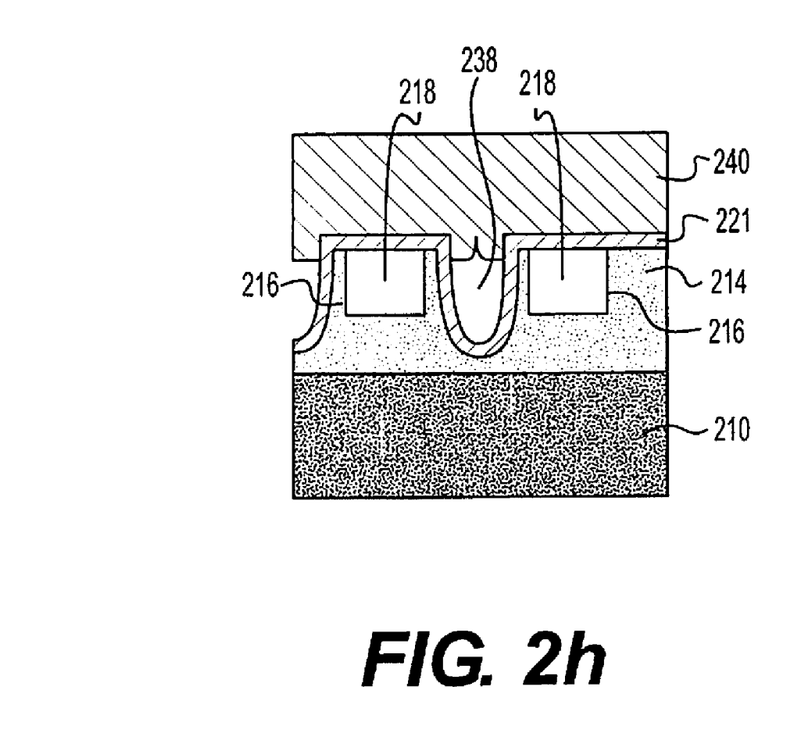
FIG. 2*h* comprises a side elevation in cross section of a semiconductor device showing dielectric deposition and pinch-off of this dielectric layer of the invention.

FIG. 2a illustrates a standard interconnect level for an electronic device 200 such as a semiconductor device, comprising a substrate such as a silicon wafer known in the art, a dielectric 214, trenches 216, having placed therein an electrical conductor 218 such as copper, and a cap 220 on top of the trenches and the conductor. FIG. 2b illustrates the deposition of an organic layer, 222 on the device 200, according to one of the methods of the invention, along with a low temperature oxide 224 and a lithographic layer 226 which has been exposed and developed to produce a pattern 228 with the same reticle as the underlying metal level. FIG. 2c illustrates pattern size shrink where the pattern 228 size is shrunk down to a pattern size 230. FIG. 2d illustrates a planarizing layer deposition of planarizing layer 232 and patterned resist layer 234, whereas FIG. 2e illustrates the etch back of layer 232. FIG. 2f illustrates a pattern transfer with the removal of elements 224 and 234, that leaves a trench 236 in the device and a narrowing of one of the walls of dielectric 214 that extend around conductor 218. FIG. 2g illustrates the device of the invention after removal of the photoresist 222 and modification of dielectric 214 to produce modified dielectric 215 according to the process of the invention, and partial removal of dielectric 218 to form a modified trench 238. FIG. 2h illustrates a device with conductor 218 surrounded with a deposited dielectric 221 which is an extension of the dielectric 220 of FIG. 2g. This device includes a further dielectric 240 deposited on dielectric 221 to pinch off modified trench 238, thereby forming an airgap as described herein.

The process of the present invention is further illustrated by the following examples.

Example 1

The desired interlevel dielectric on a semiconductor substrate was processed through a standard dual damascene scheme all the way to the deposition of the post-chemically-mechanically polished cap or thin hardmask. Following this, a 300 nm thick organic layer, 40 nm thick low temperature oxide, an antireflective coating and a standard 193 or 248 nm resist layer was coated on to the cap layer. A specific blockout mask, with 55 nm wide lines, was employed to print patterns into the resist layer. Subsequently, the patterns dimensions were shrunk by isotropic etching using an $HBr/O_2$ plasma down to a width of 25 nm. A SiOCH layer was deposited by spin coating on the resist patterns and baked at a temperature below the resist transition temperature. An etch back process using $CF_4/CH_2F_2$ plasma was used to etch the SiOCH layer down to the top of the resist patterns. Using an $O_2$-based plasma, the resist was removed, leading to trenches in the SiOCH planarizing layer, The SiOCH layer was used as a mask to etch the low temperature oxide using a $CF_4/CH_2F_2$ plasma. The organic layer was then etched using a $N_2/O_2$ plasma using the SiOCH and the LTO layers as masks. The organic layer was then used as a mask to pattern trenches into the cap layer and the intermetal dielectric. The organic layer was then removed using an ash plasma capable of modifying the intermetal dielectric. DHF was used as an etchant to etch out and remove the dielectric underneath the cap and leave behind a complete gap beneath a perforated cap. Finally, the openings in the cap were pinched-off during the deposition of the next level dielectric with very short pinch-off heights that are on the order of the trench width and little or no topography at the top of the dielectric.

Example 2

The desired interlevel dielectric on a semiconductor substrate was processed through a standard dual damascene scheme all the way to the deposition of the post-chemically-mechanically polished cap or thin hardmask. Following this, a 300 nm thick organic layer, 80 nm thick low temperature oxide, an antireflective coating and a standard 193 or 248 nm resist layer were coated on to the cap layer. The same reticle as the one used to pattern the underlying metal lines was employed to print patterns into the resist layer. Subsequently, the patterns dimensions were shrunk by isotropic etching using an HBr/O$_2$ plasma. The patterns were then partially transferred into the low temperature oxide layer. The etch was stopped before the underlying organic layer was exposed. A silicon containing ARC and a photoresist layer were deposited on the wafer surface. A specific low resolution lithography was used to define large patterns where gaps are not wanted. An etch back process using a CF4 plasma was used to etch the silicon containing ARC layer down to the top of the oxide patterns. Using a CF$_4$/CH$_2$F$_2$-based plasma, the low temperature oxide was etched away where no photoresist and/or no silicon containing ARC remain, leading to trenches in the low temperature oxide layer. The patterns were then transferred into the underlying organic layer. In the same time, the remaining photoresist was removed. The patterns were then transferred into the cap and the intermetal dielectric. In the same time, the remaining silicon containing ARC and low temperature oxide were removed. The organic layer was then removed using an ash plasma capable of modifying the intermetal dielectric. DHF was used as an etchant to etch out and remove the dielectric underneath the cap and leave behind a complete gap beneath a perforated cap. Finally, the openings in the cap were pinched-off during the deposition of the next level dielectric with very short pinch-off heights that are on the order of the trench width and little or no topography at the top of the dielectric.

The invention in another embodiment further comprises a product made by a process comprising:
a) depositing on a substrate a layer comprising at least one dielectric layer lying between interconnects;
b) depositing on the at least one dielectric layer at least one layer comprising a cap layer;
c) depositing layers comprising a sacrificial organic layer, low temperature oxide layer, ARC layer and a sacrificial first lithographic resist layer in that order on the cap layer;
d) applying on the sacrificial first lithographic resist layer a mask comprising a blockout mask with lines that project into an area between and that do not overlie the interconnects, and lithographically developing the sacrificial first lithographic resist layer through the blackout mask to form a pattern of the lines in the sacrificial first lithographic resist layer;
e) shrinking the dimension of the pattern of lines by etching wherein the etching comprises isotropic etching;
f) applying a planarizing layer that extends between and above the pattern of lines to obtain a planarizing layer with the pattern of lines, and reducing the thickness of the planarizing layer with the pattern of lines to expose the pattern of lines as a reversed tone pattern in the planarizing layer and thereby form a trench pattern in the planarizing layer;
g) selectively etching the photoresist through the trench pattern in the planarizing layer as a mask;
h) transferring the trench pattern through the ARC layer, low temperature oxide layer, sacrificial organic layer, and the cap layer, and onto the at least one dielectric layer to form a trench corresponding to the trench pattern and to form a cap layer having perforations;
i) forming an airgap comprising extracting the at least one dielectric layer between the interconnects, the extracting being conducted through the cap layer having perforations and the trench, the airgap extending from a point in the trench in the region of the cap layer having perforations to a region between the interconnects;
j) depositing a layer comprising at least a second dielectric layer on the cap layer having perforations that extend into and coats the surface of the airgap; and
k) pinching-off the cap layer having perforations with the second dielectric layer to provide a pinched-off airgap.

In another embodiment, the invention further comprises a product made by a process comprising:
a) depositing on a substrate a layer comprising at least one dielectric layer lying between interconnects;
b) depositing on the at least one dielectric layer at least one layer comprising a cap layer;
c) depositing layers comprising a sacrificial organic layer, low temperature oxide layer, ARC layer and a sacrificial lithographic resist layer in that order on the cap layer;
d) applying on the sacrificial lithographic resist layer a mask comprising a blockout mask with lines that project into an area between and that do not overlie the interconnects, and lithographically developing the lithographic resist layer through the blockout mask to form a pattern of the lines in the lithographic resist layer;
e) shrinking the dimension of the pattern of lines by etching wherein the etching comprises isotropic etching;
f) partially transferring the pattern of lines into the low temperature oxide layer
g) applying a planarizing layer that extends between and above the pattern of lines to obtain a planarizing layer with the pattern of lines;
h) applying to the planarizing layer with the pattern of lines, a second lithographic blockout mask with patterns where no gaps are desired in the region underlying the second lithographic block out mask;
i) reducing the planarizing layer with the pattern of lines down to an area comprising the top of the pattern of lines to reverse the tone of the pattern of lines in the planarizing layer and to thereby form a trench pattern in the planarizing layer;
j) selectively etching the low temperature oxide through the trench pattern in the planarizing layer and the second lithographic block out, the trench pattern in the planarizing layer and the second lithographic block out comprising masks for the selective etching;
k) transferring the trench pattern through the ARC layer, low temperature oxide layer, sacrificial organic layer, and the cap layer, and onto the at least one dielectric layer to form a trench corresponding to the trench pattern and to form a cap layer having perforations;
l) forming an airgap comprising extracting the at least one dielectric layer between the interconnects, the extracting being conducted through the cap layer having perforations and the trench, the airgap extending from a point in the trench in the region of the cap layer having perforations to a region between the interconnects;
m) depositing a layer comprising at least a second dielectric layer on the cap layer having perforations that extend into and coats the surface of the airgap; and
n) pinching-off the cap layer having perforations with the second dielectric layer to provide a pinched-off airgap.

Throughout this specification, abstract of the disclosure, and in the drawings the inventors have set out equivalents, including without limitation, equivalent elements, materials, compounds, compositions, conditions, processes, structures and the like, and even though set out individually, also include combinations of these equivalents such as the two component, three component, or four component combinations, or more as well as combinations of such equivalent elements, materials, compositions conditions, processes, structures and the like in any ratios or in any manner.

Additionally, the various numerical ranges describing the invention as set forth throughout the specification also includes any combination of the lower ends of the ranges with the higher ends of the ranges, and any single numerical value, or any single numerical value that will reduce the scope of the lower limits of the range or the scope of the higher limits of the range, and also includes ranges falling within any of these ranges.

The terms "about," "substantial," or "substantially" as applied to any claim or any parameter herein, such as a numerical value, including values used to describe numerical ranges, means slight variations in the parameter. In another embodiment, the terms "about," "substantial," or "substantially," when employed to define numerical parameter include, e.g., a variation up to five percent, ten percent, or 15 percent, or somewhat higher or lower than the upper limit of five percent, ten percent, or 15 percent. The term "up to" that defines numerical parameters means a lower limit comprising zero or a minuscule number, e.g., 0.001. The terms "about," "substantial" and "substantially" also mean that which is largely or for the most part or entirely specified. The inventors also employ the terms "substantial," "substantially," and "about" in the same way as a person with ordinary skill in the art would understand them or employ them. The phrase "at least" means one or a combination of the elements, materials, compounds, or conditions, and the like specified herein, where "combination" is defined above. The terms "written description," "specification," "claims," "drawings," and "abstract" as used herein refer to the written description, specification, claims, drawings, and abstract of the disclosure as originally filed, or the written description, specification, claims, drawings, and abstract of the disclosure as subsequently amended, as the case may be.

All scientific journal articles and other articles, including internet sites, as well as any patent or patent application that this written description mentions including the references cited in such scientific journal articles and other articles, including internet sites, and such patent or patent application, are incorporated herein by reference in their entirety and for the purpose cited in this written description and for all other disclosures contained in such scientific journal articles and other articles, including internet sites as well as any patent or patent application and the aforesaid references cited therein, as any one may bear on or apply in whole or in part, not only to the foregoing written description, but also the following claims, abstract of the disclosure, and appended drawings.

Although the inventors have described their invention by reference to some embodiments, other embodiments defined by the doctrine of equivalents are intended to be included as falling within the broad scope and spirit of the foregoing written description, and the following claims, abstract of the disclosure, and appended drawings.

We claim:
1. A product made by the process of:
a) depositing on a substrate a layer comprising at least one dielectric layer lying between interconnects;
b) depositing on said at least one dielectric layer at least one layer comprising a cap layer;
c) depositing layers comprising a sacrificial organic layer, low temperature oxide layer, ARC layer and a sacrificial first lithographic resist layer in that order on said cap layer;
d) applying on said sacrificial first lithographic resist layer a mask comprising a blockout mask with lines that project into an area between and that do not overlie said interconnects, and lithographically developing said sacrificial first lithographic resist layer through said blockout mask to form a pattern of said lines in said sacrificial first lithographic resist layer;
e) shrinking the dimension of said pattern of lines by etching wherein said etching comprises isotropic etching;
f) applying a planarizing layer that extends between and above said pattern of lines to obtain a planarizing layer with said pattern of lines, and reducing the thickness of said planarizing layer with said pattern of lines to expose said pattern of lines as a reversed tone pattern in the planarizing layer and thereby form a trench pattern in the planarizing layer;
g) selectively etching said photoresist through said trench pattern in said planarizing layer as a mask;
h) transferring said trench pattern through said ARC layer, low temperature oxide layer, sacrificial organic layer, and said cap layer, and onto said at least one dielectric layer to form a trench corresponding to said trench pattern and to form a cap layer having perforations;
i) forming an airgap comprising extracting said at least one dielectric layer between said interconnects, said extracting being conducted through said cap layer having perforations and said trench, said airgap extending from a point in said trench in the region of said cap layer having perforations to a region between said interconnects;
j) depositing a layer comprising at least a second dielectric layer on said cap layer having perforations that extend into and coats the surface of said airgap; and
k) pinching-off said cap layer having perforations with said second dielectric layer to provide a pinched-off airgap.
2. A product made by the process of:
a) depositing on a substrate a layer comprising at least one dielectric layer lying between interconnects;
b) depositing on said at least one dielectric layer at least one layer comprising a cap layer;
c) depositing layers comprising a sacrificial organic layer, low temperature oxide layer, ARC layer and a sacrificial lithographic resist layer in that order on said cap layer;
d) applying on said sacrificial lithographic resist layer a mask comprising a blockout mask with lines that project into an area between and that do not overlie said interconnects, and lithographically developing said lithographic resist layer through said blockout mask to form a pattern of said lines in said lithographic resist layer;
e) shrinking the dimension of said pattern of lines by etching wherein said etching comprises isotropic etching;
f) partially transferring said pattern of lines into said low temperature oxide layer
g) applying a planarizing layer that extends between and above said pattern of lines to obtain a planarizing layer with said pattern of lines;
h) applying to said planarizing layer with said pattern of lines, a second lithographic blockout mask with patterns where no gaps are desired in the region underlying said second lithographic block out mask;
i) reducing said planarizing layer with said pattern of lines down to an area comprising the top of said pattern of lines to reverse the tone of said pattern of lines in said planarizing layer and to thereby form a trench pattern in said planarizing layer;
j) selectively etching said low temperature oxide through said trench pattern in said planarizing layer and said second lithographic block out, said trench pattern in said planarizing layer and said second lithographic block out comprising masks for said selective etching;
k) transferring said trench pattern through said ARC layer, low temperature oxide layer, sacrificial organic layer, and said cap layer, and onto said at least one dielectric layer to form a trench corresponding to said trench pattern and to form a cap layer having perforations;
l) forming an airgap comprising extracting said at least one dielectric layer between said interconnects, said extract- ing being conducted through said cap layer having perforations and said trench, said airgap extending from a point in said trench in the region of said cap layer having perforations to a region between said interconnects;

m) depositing a layer comprising at least a second dielectric layer on said cap layer having perforations that extend into and coats the surface of said airgap; and n) pinching-off said cap layer having perforations with said second dielectric layer to provide a pinched-off airgap.

3. The product of claim 1 wherein said first lithographic step comprises projection lithography and employs a reticle corresponding to said interconnect.

4. The product of claim 2 wherein said first lithographic step comprises projection lithography and employs a reticle corresponding to said interconnect.

5. The product of claim 1 wherein said interconnect comprises a copper interconnect.

6. The product of claim 2 wherein said interconnect comprises a copper interconnect.

7. The product of claim 1 wherein said reducing said planarizing layer with said pattern of lines comprises an etching step or a chemical mechanical polishing step.

8. The product of claim 2 wherein said reducing said planarizing layer with said pattern of lines comprises an etching step or a chemical mechanical polishing step.

9. The product of claim 1 wherein said patterns in said blockout masks comprise sub-lithographic patterns.

10. The product of claim 2 wherein said patterns in said blockout masks comprise sub-lithographic patterns.

11. The product of claim 1 wherein said patterns in said blockout masks comprise supra-lithographic patterns.

12. The product of claim 2 wherein said patterns in said blockout masks comprise supra-lithographic patterns.

13. The product of claim 1 wherein said patterns are optionally transferred in said dielectric layer using reactive ion etching.

14. The product of claim 2 wherein said patterns are optionally transferred in said dielectric layer using reactive ion etching.

15. The product of claim 1 wherein said airgaps extend to a level into said at least one dielectric layer to a level beyond the deepest level of said interconnects.

16. The product of claim 2 wherein said airgaps extend to a level into said at least one dielectric layer to a level beyond the deepest level of said interconnects.

17. The product of claim 14 wherein said airgaps extend into said at least one dielectric layer to a level at least about 25% deeper than the deepest level of said interconnects.

18. The product of claim 15 said airgaps extend into said at least one dielectric layer to a level at least about 25% deeper than the deepest level of said interconnects.

19. The product of claim 1 wherein the width of the perforations comprises a width at least as small as the minimum distance between said interconnects.

20. The product of claim 2 wherein the width of the perforations comprises a width at least as small as the minimum distance between said interconnects.

21. The product of claim 1 wherein the width of the perforations comprises a width smaller than the minimum distance between said interconnects.

22. The product of claim 2 wherein the width of the perforations comprises a width smaller than the minimum distance between said interconnects.

23. The product of claim 1 further comprising:
a) depositing a conformal layer on said cap layer;
b) etching through the bottom of said conformal layer.

24. The product of claim 2 further comprising:
a) depositing a conformal layer on said cap layer; and
b) etching through the bottom of said conformal layer.

25. The product of claim 23 wherein the thickness of said conformal layer comprises a thickness from about 5 nm to about 25 nm.

26. The product of claim 24 wherein the thickness of said conformal layer comprises a thickness from about 5 nm to about 25 nm.

27. The product of claim 23 wherein said conformal layer is deposited by a process comprising CVD, ALD, spin-on or combinations thereof.

28. The product of claim 24 wherein said conformal layer is deposited by a process comprising CVD, ALD, spin-on or combinations thereof.

29. The product of claim 1 further comprising:
a) depositing an imprintable mask layer on said low temperature oxide layer in place of said ARC and resist layers; and
b) transferring said pattern into said underlying layers and optionally, said dielectric layer.

30. The product of claim 2 further comprising:
a) depositing an imprintable mask layer on said low temperature oxide layer in place of said ARC and resist layers; and
b) transferring said pattern into said underlying layers and optionally, said dielectric layer.

31. The product of claim 1 wherein said extracting step comprises an etching step.

32. The product of claim 2 wherein said extracting step comprises an etching step.

33. The product of claim 31 wherein said etching step comprises etching with a vapor based etchant, wet etchant, $CO_2$ based etchant and combinations thereof.

34. The product of claim 32 wherein said etching step comprises etching with a vapor based etchant, wet etchant, $CO_2$ based etchant and combinations thereof.

35. The product of claim 31 wherein said etchant comprises an acidic etchant.

36. The product of claim 32 wherein said etchant comprises an acidic etchant.

37. The product of claim 31 said etchant comprises a basic etchant.

38. The product of claim 32 wherein said etchant comprises a basic etchant.

39. The product of claim 1 further comprising depositing a second cap layer prior to said deposition of said at least second dielectric layer.

40. The product of claim 2 further comprising depositing a second cap layer prior to said deposition of said at least second dielectric layer.

41. The product of claim 39 wherein said perforations comprise perforations pinched-off by at least one of the steps of the deposition of said second cap layer or the deposition of said second dielectric.

42. The product of claim 40 wherein said perforations comprise perforations pinched-off by at least one of the steps of the deposition of said second cap layer or the deposition of said second dielectric.

* * * * *